United States Patent
Padmabandu

(10) Patent No.: US 12,253,806 B2
(45) Date of Patent: Mar. 18, 2025

(54) GAS PURGE SYSTEMS FOR A LASER SOURCE

(71) Applicant: Cymer, LLC, San Diego, CA (US)

(72) Inventor: Gamaralalage G Padmabandu, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 130 days.

(21) Appl. No.: 17/784,948

(22) PCT Filed: Dec. 8, 2020

(86) PCT No.: PCT/US2020/063777
§ 371 (c)(1),
(2) Date: Jun. 13, 2022

(87) PCT Pub. No.: WO2021/126594
PCT Pub. Date: Jun. 24, 2021

(65) Prior Publication Data
US 2022/0413402 A1    Dec. 29, 2022

Related U.S. Application Data

(60) Provisional application No. 63/022,023, filed on May 8, 2020, provisional application No. 62/951,840, filed on Dec. 20, 2019.

(51) Int. Cl.
G03F 7/20 (2006.01)
G03F 7/00 (2006.01)
(Continued)

(52) U.S. Cl.
CPC ...... *G03F 7/70933* (2013.01); *G03F 7/70025* (2013.01); *H01S 3/0071* (2013.01); *H01S 3/036* (2013.01)

(58) Field of Classification Search
CPC ............ G03F 7/70933; G03F 7/70025; H01S 3/0071; H01S 3/036; H01S 3/03;
(Continued)

(56) References Cited

U.S. PATENT DOCUMENTS

| | | | |
|---|---|---|---|
| 5,771,260 A | 6/1998 | Elliott et al. | |
| 6,341,006 B1 * | 1/2002 | Murayama | G03F 7/70833 250/492.1 |

(Continued)

FOREIGN PATENT DOCUMENTS

| | | |
|---|---|---|
| JP | 1999-195585 A | 7/1999 |
| JP | 2003100608 A | 4/2003 |

(Continued)

OTHER PUBLICATIONS

Office Action, counterpart Japanese Patent Application No. 2022-532784, mailed Jul. 21, 2023, 13 pages total (including English translation of 7 pages).

(Continued)

*Primary Examiner* — Mesfin T Asfaw
(74) *Attorney, Agent, or Firm* — DiBerardino McGovern IP Group LLC

(57) ABSTRACT

A laser source includes a laser chamber configured to generate a first laser beam. The laser source further includes an optical system coupled to the laser chamber and configured to receive the first laser beam and output an output laser beam. The laser source also includes a gas purge system. According to some aspects, the gas purge system is configured to supply a nitrogen gas into the optical system at a pressure less than atmospheric pressure. According to some aspects, the gas purge system is configured to supply a helium gas into the optical system.

20 Claims, 6 Drawing Sheets

(51) Int. Cl.
  *H01S 3/00*  (2006.01)
  *H01S 3/036*  (2006.01)
(58) Field of Classification Search
  CPC ...... H01S 3/22; H01S 3/2258; H01S 3/10046;
      H01S 3/2256; H01S 3/225; H01S
      3/09702; H01S 3/134; H01S 3/1305;
      H01S 3/2366; H01S 3/2251; H01S
      3/08009
  See application file for complete search history.

(56) References Cited

U.S. PATENT DOCUMENTS

| | | | |
|---|---|---|---|
| 6,559,922 | B2 | 5/2003 | Hansell et al. |
| 6,792,023 | B1 | 9/2004 | Kleinschmidt et al. |
| 6,940,582 | B1 * | 9/2005 | Tanaka .................... H01J 37/20 |
| | | | 355/75 |
| 2001/0000606 | A1 | 5/2001 | Gortler et al. |
| 2003/0142714 | A1 | 7/2003 | Yamashita et al. |
| 2004/0190578 | A1 | 9/2004 | Partlo et al. |
| 2006/0007414 | A1 | 1/2006 | Luttikhuis et al. |
| 2006/0055900 | A1 * | 3/2006 | Van Der Net ...... G03F 7/70925 |
| | | | 355/53 |
| 2006/0056478 | A1 | 3/2006 | Albrecht et al. |
| 2008/0170210 | A1 | 7/2008 | Meijer et al. |
| 2016/0322772 | A1 * | 11/2016 | Abe ...................... H01S 3/2258 |
| 2018/0196361 | A1 * | 7/2018 | Janssen ............... G03F 7/70033 |
| 2018/0364596 | A1 | 12/2018 | Chang et al. |

FOREIGN PATENT DOCUMENTS

| | | |
|---|---|---|
| JP | 2003249702 A | 9/2003 |
| JP | 2005502209 A | 1/2005 |
| JP | 2006032953 A | 2/2006 |
| JP | 2010517260 A | 5/2010 |
| KR | 10-2005-0012235 A | 1/2005 |
| TW | 480796 B | 3/2002 |
| WO | 2003-096497 A1 | 11/2003 |

OTHER PUBLICATIONS

Patrik Flierl, European International Searching Authority, International Search Report and Written Opinion, counterpart PCT Application No. PCT/US2020/063777, mailed Mar. 24, 2021, 9 pages total.

The Korean Intellectual Property Office, Office Action, counterpart Korean Patent Application No. 10-2022-7019749 mailed Sep. 1, 2023, 16 pages total (including English translation of 7 pages).

* cited by examiner

GAS PURGE SYSTEMS FOR A LASER SOURCE

CROSS REFERENCE TO RELATED APPLICATIONS

This application claims priority to U.S. Application No. 62/951,840, filed Dec. 20, 2019 and titled LOW PRESSURE GAS PURGE SYSTEM FOR A LASER SOURCE; and U.S. Application No. 63/022,023, filed May 8, 2020 and titled GAS PURGE SYSTEMS FOR A LASER SOURCE, both of which are incorporated herein in their entireties by reference.

FIELD

The present disclosure relates to systems and methods for providing a gas purge system in a laser source for use in, for example, lithographic apparatuses and systems.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC being formed. This pattern can be transferred onto a target portion (e.g., comprising part of, one, or several dies) on a substrate (e.g., a silicon wafer). Transfer of the pattern is typically via imaging onto a layer of radiation-sensitive material (photoresist, or simply "resist") provided on the substrate. In general, a single substrate will contain a network of adjacent target portions that are successively patterned. Known lithographic apparatus includes so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the target portions parallel or opposite the scanning direction. It is also possible to transfer the pattern from the patterning device to the substrate by imprinting the pattern onto the substrate.

A laser source can be used with the lithographic apparatus for, for example, generating illumination radiation for illuminating the patterning device. Oxygen ($O_2$) may be present in the optical path of the laser beam within the laser source. However, ozone ($O3$) created from oxygen ($O_2$) in the presence of the laser beam can be detrimental to optical components in the laser source.

SUMMARY

Accordingly, there is a need for a gas purge system and a gas purge method for a laser source.

Embodiments of low pressure and other gas purge systems and low pressure and other gas purge methods are described in the present disclosure.

One aspect of the present disclosure provides a laser source that includes a laser chamber configured to generate a first laser beam. The laser source further includes an optical system coupled to the laser chamber and configured to receive the first laser beam and output an output laser beam. The laser source also includes a gas purge system configured to supply a gas into the optical system at a pressure less than atmospheric pressure.

In some examples, the gas purge system includes a gas supply pump configured to supply the gas into the optical system at the pressure less than atmospheric pressure. In some examples, the gas purge system also includes a second pump configured to substantially remove a second gas from the optical system.

In some examples, the gas includes nitrogen and the second gas includes oxygen. In some examples, the pressure is between about 50 Torr and about 700 Torr.

In some examples, the optical system includes a first optical module and a second optical module. The gas purge system includes a first gas supply pump coupled to the first optical module to supply the gas into the first optical module at the pressure less than atmospheric pressure and a second gas supply pump coupled to the second optical module to supply the gas into the second optical module at the pressure less than atmospheric pressure.

Another aspect of the present disclosure provides a laser source that includes a laser chamber configured to generate a first laser beam. The laser source further includes an optical system coupled to the laser chamber and configured to receive the first laser beam and output an output laser beam. The optical system includes a gas at a pressure less than atmospheric pressure.

Another aspect of the present disclosure provides a laser source that includes a first laser chamber configured to generate a first laser beam and a second laser chamber configured to receive the first laser beam and amplify the first laser beam to generate a second laser beam. The laser source further includes a first optical system configured to direct the first laser beam toward the second laser chamber. The laser source also includes a second optical system configured to receive the second laser beam and direct the second laser beam as an output laser beam of the laser source. The laser source further includes a gas purge system configured to pump a gas into the first and second optical systems at a pressure less than atmospheric pressure.

In some examples, the gas purge system includes a gas supply pump configured to supply the gas into the first and second optical systems at the pressure less than atmospheric pressure and a second pump configured to substantially remove a second gas from the first and second optical systems.

In some examples, the gas includes nitrogen, the pressure is between about 50 Torr and about 700 Torr, and the second gas in oxygen.

In some examples, the laser source further includes an optical module coupled to the first laser chamber. The optical module includes a second gas at a pressure about atmospheric pressure. In some examples, the second gas is oxygen.

Another aspect of the present disclosure provides a lithographic apparatus that includes an illumination system configured to condition a radiation beam and a projection system configured to project a pattern imparted to the radiation beam onto a substrate. The illumination system includes a laser source. The laser source includes a laser chamber configured to generate a first laser beam and an optical system coupled to the laser chamber and configured to receive the first laser beam and output an output laser beam. The optical system may include nitrogen gas at a pressure less than atmospheric pressure.

Another aspect of the present disclosure provides an apparatus that includes a laser chamber configured to generate a first laser beam and an optical system coupled to the laser chamber and configured to receive the first laser beam and output an output laser beam. The laser source further includes a gas purge system configured to supply a gas into the optical system at a pressure less than atmospheric pressure.

Additionally, or alternatively, embodiments of helium gas purge systems are provided in the present disclosure.

One aspect of the present disclosure provides a laser source that includes a laser chamber configured to generate a first laser beam. The laser source further includes an optical system coupled to the laser chamber and configured to receive the first laser beam and output an output laser beam. The laser source also includes a gas purge system configured to supply a helium gas into the optical system.

In some examples, the gas purge system includes a gas supply pump configured to supply the helium gas into the optical system. In some examples, the gas purge system further includes a second pump configured to substantially remove a second gas from the optical system, where the gas is oxygen.

In some examples, the gas purge system includes a gas supply pump configured to supply the helium gas into the optical system at a pressure less than atmospheric pressure.

In some examples, the optical system includes a first optical module and a second optical module. The gas purge system includes a first gas supply pump coupled to the first optical module to supply the helium gas into the first optical module and a second gas supply pump coupled to the second optical module to supply the helium gas into the second optical module.

Another aspect of the present disclosure provides a laser source that includes a laser chamber configured to generate a first laser beam. The laser source further includes an optical system coupled to the laser chamber and configured to receive the first laser beam and output an output laser beam. The optical system includes a helium gas.

Another aspect of the present disclosure provides a laser source that includes a first laser chamber configured to generate a first laser beam and a second laser chamber configured to receive the first laser beam and amplify the first laser beam to generate a second laser beam. The laser source further includes a first optical system configured to direct the first laser beam toward the second laser chamber. The laser source also includes a second optical system configured to receive the second laser beam and direct the second laser beam as an output laser beam of the laser source. The laser source further includes a gas purge system configured to pump a helium gas into the first and second optical systems.

Another aspect of the present disclosure provides a lithographic apparatus that includes an illumination system configured to condition a radiation beam and a projection system configured to project a pattern imparted to the radiation beam onto a substrate. The illumination system includes a laser source. The laser source includes a laser chamber configured to generate a first laser beam and an optical system coupled to the laser chamber and configured to receive the first laser beam and output an output laser beam. The optical system may include helium gas.

Further features, as well as the structure and operation of various embodiments, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the embodiments of this disclosure and to enable a person skilled in the relevant art(s) to make and use the embodiments of this disclosure.

Figure 1:
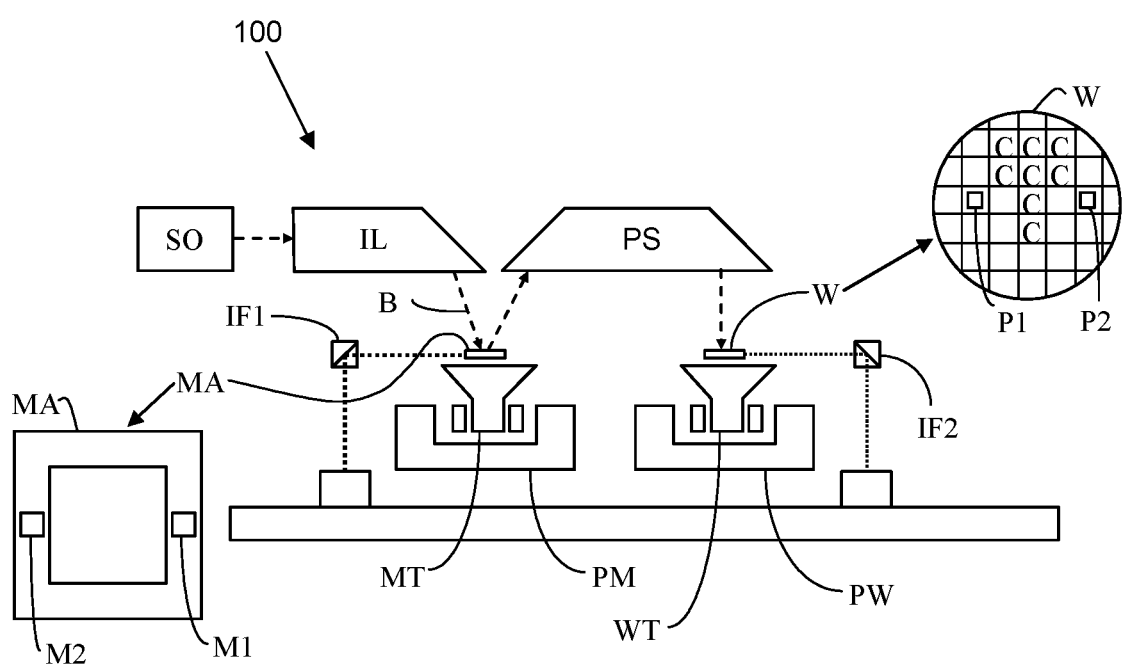
FIG. 1 is a schematic illustration of a reflective lithographic apparatus, according to an exemplary embodiment.

The features the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," "an exemplary embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Before describing such embodiments in more detail, however, it is instructive to present an example environment in which embodiments of the present disclosure may be implemented.

Example Lithographic Systems

Figure 2:
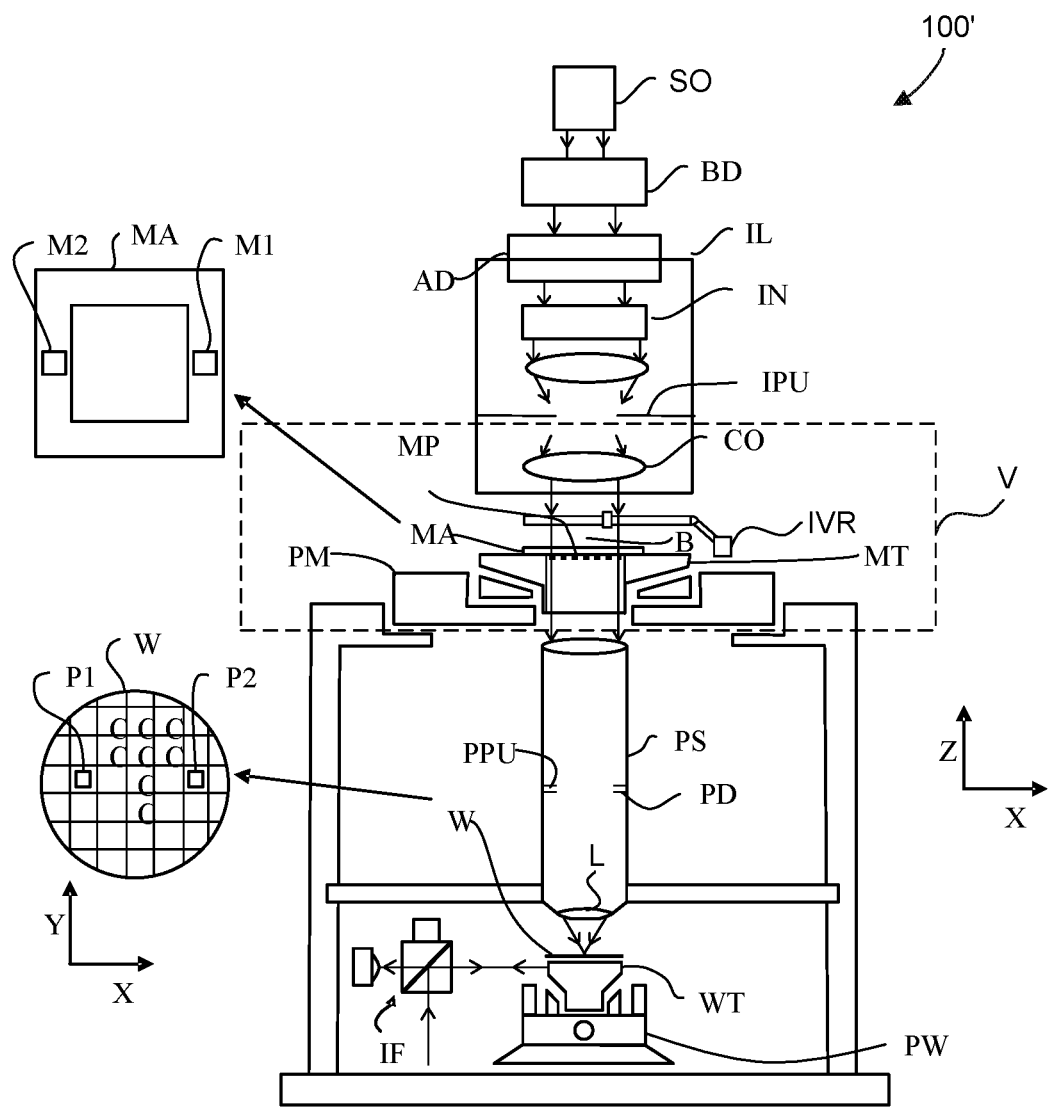
FIG. 2 is a schematic illustration of a transmissive lithographic apparatus, according to an exemplary embodiment.

FIGS. 1 and 2 are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet (DUV) radiation); a support structure (for example, a mask table) MT configured to support a patterning device (for example, a mask, a reticle, or a dynamic patterning device) MA and connected to a first positioner PM configured to accurately position the patterning device MA; and, a substrate holder such as a table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 2) or reflective (as in lithographic apparatus 100 of FIG. 1). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1 and 2, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 2) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 2) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 2), such as an integrator IN and a condenser CO. The illuminator IL can be used to condition the radiation beam B to have a desired uniformity and intensity distribution in its cross section.

Referring to FIG. 1, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 2, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations).

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 2) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

Exemplary Lithographic Cell

Figure 3:
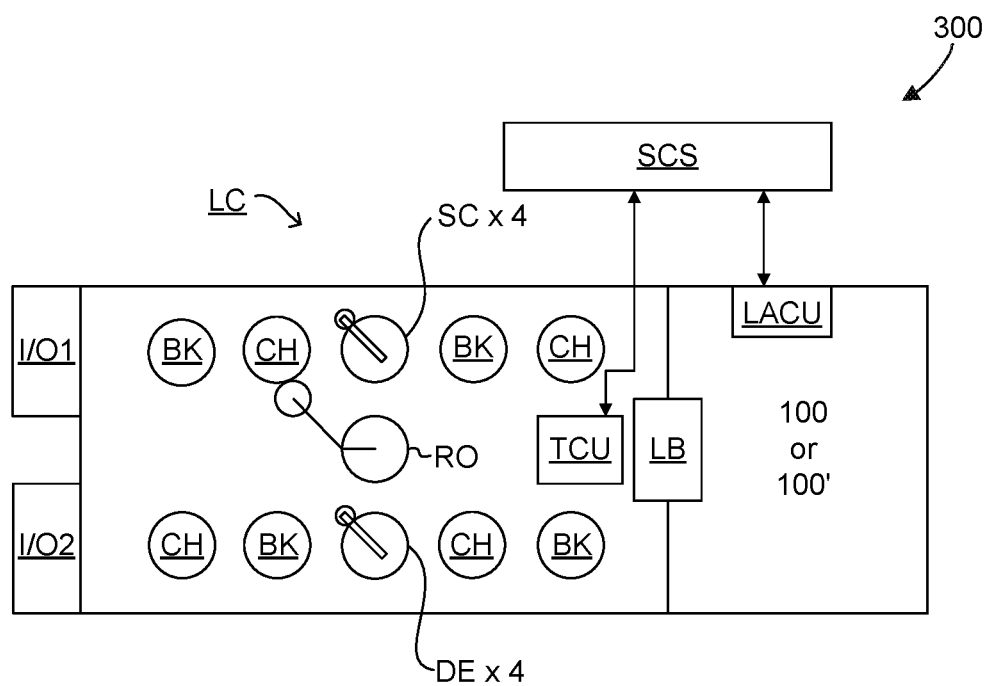
FIG. 3 is a schematic illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit photoresist, i.e. "resist" layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Gas Purge Systems and Methods

Figure 4:
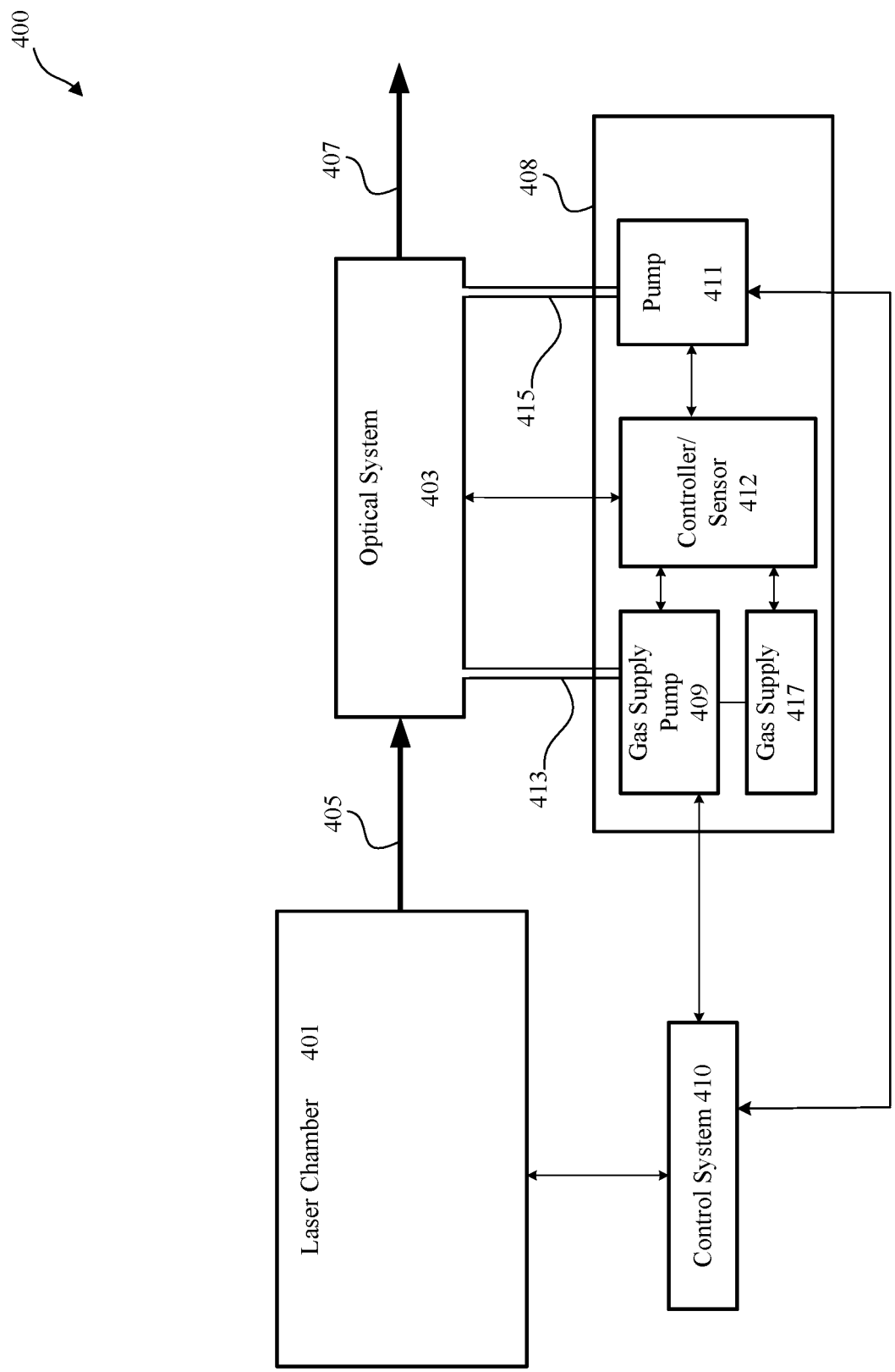
FIG. 4 illustrates a schematic of a laser source with a purge system, according to some embodiments of the present disclosure.

FIG. 4 illustrates a schematic of a laser source 400 with a gas purge system, according to some embodiments of the present disclosure. In some aspects, laser source 400 can be used as part of, or in addition to, source SO of lithographic apparatus 100 or 100'. For example, laser source 400 can be used in generating DUV radiation to be used in lithographic apparatus 100' or other DUV lithographic apparatuses. As illustrated in FIG. 4, laser source 400 can generate laser beam 407, which is used in the lithographic apparatus.

According to some aspects, laser source 400 can include one or more laser chambers to generate the laser beam. For example, laser source 400 can include laser chamber 401, which generates laser beam 405. Although one laser chamber 401 is illustrated in FIG. 4, the aspects of this disclosure are not limited to this example and laser source 400 can include multiple laser chambers. Examples of a dual chamber laser source is discussed below with respect to FIGS. 5 and 6.

As illustrated in FIG. 4, laser source 400 can also include optical system 403. According to some examples, optical system 403 is configured to receive laser beam 405 and generate or direct laser beam 407 out of laser source 400. As discussed in more detail below, optical system 403 can include one or more optical modules. As a non-limiting example, optical system 403 can include one or more bellows, one or more tubes, one or more beam reversers, one or more bandwidth analysis modules, one or more optical pulse stretchers, one or more shutter modules, etc. It is noted that the aspects of this disclosure are not limited to these examples, and optical system 403 can include more, less, or different modules and components. Optical system 403 can include any number of components such as, but not limited to, lenses, mirrors, prisms, fiber-optics, detectors, beam splitters, dispersing devices, etc.

According to some aspects, laser source 400 can include gas purge system 408. Gas purge system 408 can be operationally coupled to optical system 403 and can be configured to supply a gas to optical system 403. In optical system 403, ozone ($O_3$) can be undesirably created from oxygen ($O_2$) in the presence of high energy UV photons. The ozone can be detrimental to the optical components of optical system 403. According to some examples, gas purge system 408 is configured to supply gas to optical system 403 to substantially remove oxygen from optical system 403. According to some aspects, the gas used by gas purge system 408 can include nitrogen ($N_2$). In other words, gas purge system 408 can supply nitrogen to optical system 403 to substantially remove oxygen from optical system 403. Although nitrogen is used as one exemplary purge gas in some aspects of this disclosure, other suitable gases can be used by gas purge system 408.

According to some examples, gas purge system 408 can provide the purge gas (e.g., nitrogen) to optical system 403 at a pressure of about atmospheric pressure. For example, the gas pressure provided by gas purge system 408 can be about standard atmosphere pressure. For example, the gas pressure provided by gas purge system 408 can be about 101,000 Pa-102,000 Pa (e.g., equivalent to 758-765 mm Hg). As a non-limiting example, the gas pressure provided by gas purge system 408 can be about 101,325 Pa (e.g., equivalent to 760 mm Hg). In other embodiments, various other pressures can be used.

In some examples, however, by using the gas pressure of about atmospheric pressure for the purge gas at optical system 403, some optical specifications for optical system 403 (and/or laser source 400) cannot be met. For example, for a high power laser source 400 (for example, but not limited to, 60 W, 90 W, 120 W, etc.), gas pressures other than atmospheric pressure can produce more desirable optical performance. In some examples, the gas pressure of about atmospheric pressure at optical system 403 can result in high thermal transients. The high thermal transients can lead to failing modules. The thermal transients can increase with higher power lasers and/or module ages. Additionally, the gas pressure of about atmospheric pressure in optical system 403 can result in high instability in the laser spatial beam properties. For example, while vertical divergence is one exemplary parameter difficult to contain, other parameters can also be affected by increased thermal lensing effects. Some examples of the affected parameters are beam symmetry, beam contour mismatch, and, to some degree, the beam pointing. While each parameter can have its own origin, some of these parameters are inter-related.

In some examples, the thermal transients are originated from the purge gas (e.g., nitrogen) being heated in optical system 403 by, for example, the laser beam. For example, the index of refraction of nitrogen has a large temperature gradient. The large temperature gradient of the index of refraction creates a large thermal lensing for the laser beam.

According to some aspects of this disclosure, gas purge system 408 is a low pressure gas purge system configured to supply the purge gas (e.g., nitrogen) to optical system 403 at a pressure less than atmospheric pressure. By reducing the pressure of the purge gas, the density of the purge gas at optical system 403 is reduced and therefore, the magnitude of the thermal lensing is also reduced. The density of the purge gas is proportional to its pressure. By reducing the pressure, the density of the purge gas is reduced, and thereby the index of refraction is reduced. Since temperature gradient or the change of index of refraction is proportional to the density of the purge gas, theoretically, the thermal transient can be reduced.

According to some examples, gas purge system 408 is configured to supply the purge gas to optical system 403 at a pressure less than atmospheric pressure. For example, the pressure of the purge gas is less than about standard atmosphere pressure. For example, the pressure of the purge gas may be less than about 760 Torr (e.g., about 760 mmHg). In some embodiments, the pressure of the purge gas may be between about 700 Torr and about 760 Torr. In some embodiments, the pressure of the purge gas is between about 600 Torr and about 700 Torr. In some embodiments, the pressure of the purge gas is between about 500 Torr and about 600 Torr. In some embodiments, the pressure of the purge gas is between about 400 Torr and about 500 Torr. In some embodiments, the pressure of the purge gas is between about 300 Torr and about 400 Torr. In some embodiments, the pressure of the purge gas is between about 200 Torr and about 300 Torr. In some embodiments, the pressure of the purge gas is between about 100 Torr and about 200 Torr. In some embodiments, the pressure of the purge gas is between about 10 Torr and about 100 Torr. In some embodiments, the pressure of the purge gas is between about 50 Torr and about 90 Torr. In some embodiments, the pressure of the purge gas is between about 1 Torr and about 10 Torr. It is noted that these pressure values are provided as examples and other pressure values less than atmospheric pressure can be used for the purge gas.

As illustrated in FIG. 4, gas purge system 408 can include gas supply pump 409, pump 411, and gas supply 417. In some aspects, gas purge system 408 can be operationally coupled to optical system 403 using one or more gas supply conduits 413 and one or more gas conduits 415.

For example, one or more gas supply conduits 413 can be operationally coupled to gas supply pump 409 to supply the purge gas (e.g., nitrogen) from, for example, gas supply 417, to optical system 403. Gas supply conduits 413 can terminate at one or more gas inlets (not shown) at optical system 403, according to some example. Gas supply conduits 413 can be coupled to gas supply pump 409 through one or more gas outlets (not shown), according to some examples. In some aspects, gas supply pump 409 is configured to supply the purge gas to optical system 403 at the pressure less than atmospheric pressure.

One or more gas conduits 415 can be operationally coupled to pump 415 to remove gas (e.g., oxygen) from optical system 403. Gas conduits 415 can terminate at one or more gas inlets (not shown) at pump 411, according to some example. Gas conduits 415 can be coupled to optical system 403 through one or more gas outlets (not shown), according to some examples. In some aspects, pump 411 can be configured to create negative pressure difference (e.g., a suction pump, etc.), and can be operationally coupled to optical system 403 to remove gas (e.g., oxygen) from optical system 403.

In some examples, gas purge system 408 can include one or more sensors and controllers 412 to, for example, measure and/or control the gas pressure. For example, controller/sensor 412 can be configured to measure the pressure of the purge gas that is supplied to optical system 403 by gas purge system 408. For example, controller/sensor 412 can be configured to measure the pressure of the purge gas at gas supply pump 409, at optical system 403, at gas supply 417, at pump 411, at conduit(s) 413 and/or 415, and/or at the inlet and/or outlet(s) associated with conduit(s) 413 and/or 415. Additionally, or alternatively, controller/sensor 412 can be configured to control gas supply pump 409, gas supply 417, and/or pump 411 based on, for example, the measured pressure and one or more pressure set points. Also, controller/sensor 412 can be configured to measure the pressure of the gas (e.g., oxygen) that is removed from optical system 403. For example, controller/sensor 412 can be configured to measure the pressure of the gas (e.g., oxygen) that is removed from optical system 403 at pump 411, at conduit 415, and/or at the inlet or outlet associated with conduit 415.

In some examples, control system 410 can be configured to control gas supply pump 409 and/or pump 411 alone or in combination with controller sensor 412. According to some embodiments, control system 410 can be configured to perform other operations in laser source 400. For example, control system 410 can control one or more gas sources (not shown) that provide gas to laser chamber 401. As another example, control system 410 can be connected to one or more temperature sensors in laser chamber 401 to detect and/or control the gas temperatures in laser chamber 401.

In a non-limiting example, by using gas purge system 408 as a low pressure gas purge system configured to supply the purge gas (e.g., nitrogen) to optical system 403 at a pressure less than atmospheric pressure, the terminal instability in vertical beam divergence in optical system 403 can be reduced by, for example, five times. As a non-limiting example, vertical divergence instability range can be reduced from about 0.6 mrad (Millirad or milliradians) to about 0.13 mrad if the pressure of the purge gas (e.g., nitrogen) to optical system 403 is reduced from about 760 Torr to about 100 Torr. In some examples, 1 mrad can be a divergence (e.g., an expansion or widening) of a laser beam when the diameter of the laser beam increases 1 mm per 1 m of a beam path. In another non-limiting example, for high power laser source 400 (for example, but not limited to, 90 W) by using gas purge system 408 as a low pressure gas purge system, a duty cycle performance can change from, for example, about 20% to about 75%. It is noted that these are provided as non-limiting examples, and other improvements can be observed in using gas purge system 408 as a low pressure gas purge system. In addition to direct beam divergence improvement, the embodiments of this disclosure can improve stability in beam symmetry, contour mismatch, and/or laser linewidth.

Additionally, or alternatively, gas purge system 408 can be a helium gas purge system configured to supply the purge gas (e.g., helium) to optical system 403, according to some aspects of this disclosure. In this exemplary embodiments. In this example, gas purge system 408 is configured to supply helium gas as the purge gas to optical system 403. In other words, the nitrogen gas purge can be replaced by helium gas to reduce and/or eliminate the thermal lensing effects discussed above that are contributed to nitrogen. According to some examples, using helium as the purge gas can reduce and/or eliminate the thermal lensing effects because of the optical properties of the helium gas, such as but not limited to, low (or ultra-low) temperature gradient of the index of refraction associated with helium. In some examples, small volumes of helium can be used. In a non-limiting example, small volumes of helium such as, but not limited to, a minimum volume less than 1 standard liter per minute (slpm) can be used to maintain, for example, less than 20 part per million (ppm) of oxygen in optical system 403. This can be compared to about 10 slpm for nitrogen. It is noted that this volume of helium is provided as a non-limiting example, and other volumes of helium can be used.

According to some aspects of this disclosure, one or more gas supply conduits 413 can be operationally coupled to gas supply pump 409 to supply the purge gas (e.g., helium) from, for example, gas supply 417, to optical system 403. Gas supply 417 can include the purge gas (e.g., helium). Gas supply conduits 413 can terminate at one or more gas inlets (not shown) at optical system 403, according to some example. Gas supply conduits 413 can be coupled to gas supply pump 409 through one or more gas outlets (not shown), according to some examples. In some aspects, gas supply pump 409 is configured to supply the purge gas (e.g., helium) to optical system 403. According to some aspects of this disclosure, gas purge system 408 is configured to supply the purge gas (e.g., helium) to optical system 403 at about atmospheric pressure. Alternatively, gas purge system 408 is configured to supply the purge gas (e.g., helium) to optical system 403 at pressures less or greater than atmospheric pressure.

One or more gas conduits 415 can be operationally coupled to pump 415 to remove gas (e.g., oxygen) from optical system 403. Gas conduits 415 can terminate at one or more gas inlets (not shown) at pump 411, according to some example. Gas conduits 415 can be coupled to optical system 403 through one or more gas outlets (not shown), according to some examples. In some aspects, pump 411 can be configured to create negative pressure difference (e.g., a suction pump, etc.), and can be operationally coupled to optical system 403 to remove gas (e.g., oxygen) from optical system 403.

In some examples, gas purge system 408 can include one or more sensors and controllers 412 to, for example, measure and/or control the gas pressure. For example, controller/sensor 412 can be configured to measure the pressure of the purge gas (e.g., helium) that is supplied to optical system 403 by gas purge system 408. For example, controller/sensor 412 can be configured to measure the pressure of the purge gas (e.g., helium) at gas supply pump 409, at optical system 403, at gas supply 417, at pump 411, at conduit(s) 413 and/or 415, and/or at the inlet and/or outlet(s) associated with conduit(s) 413 and/or 415. Additionally, or alternatively, controller/sensor 412 can be configured to control gas supply pump 409, gas supply 417, and/or pump 411 based on, for example, the measured pressure and one or more pressure set points. Also, controller/sensor 412 can be configured to measure the pressure of the gas (e.g., oxygen) that is removed from optical system 403. For example, controller/sensor 412 can be configured to measure the pressure of the gas (e.g., oxygen) that is removed from optical system 403 at pump 411, at conduit 415, and/or at the inlet or outlet associated with conduit 415.

In some examples, control system 410 can be configured to control gas supply pump 409 and/or pump 411 alone or in combination with controller sensor 412. According to some embodiments, control system 410 can be configured to perform other operations in laser source 400. For example, control system 410 can control one or more gas sources (not shown) that provide gas to laser chamber 401. As another example, control system 410 can be connected to one or more temperature sensors in laser chamber 401 to detect and/or control the gas temperatures in laser chamber 401.

In a non-limiting example, by using gas purge system 408 as helium gas purge system configured to supply the purge gas (e.g., helium) to optical system 403, the terminal instability in vertical beam divergence in optical system 403 can be reduced by, for example, five times. As a non-limiting example, the vertical divergence instability range can be reduced from about 0.6 mrad to about 0.13 mrad if the purge gas is helium. In another non-limiting example, for high power laser source 400 (for example, but not limited to, 90 W) using gas purge system 408 as the helium purge system, a duty cycle performance can change from, for example, about 20% to about 75%. It is noted that these are provided as non-limiting examples, and other improvements can be seen in using gas purge system 408 as the helium purge system. In addition to direct beam divergence improvement, the embodiments of this disclosure can improve thermal lensing, margins on differential firing time between the seed laser and amplifier gain medium (dtMOPA) range, horizontal divergence, pointing stability, ultra-low beam stability, and/or laser bandwidth stability.

It is noted that although one gas supply pump 409, one pump 411, one gas supply 417, and two gas conduits 413 and 415 are illustrated in FIG. 4, the aspects of this disclosure are not limited to these examples and gas purge system 408 can include any number of gas supplies, pumps, and gas conduits. Also, gas purge system 408 can be located inside laser source 400, outside laser source 400, or partially outside laser source 400.

Figure 5:
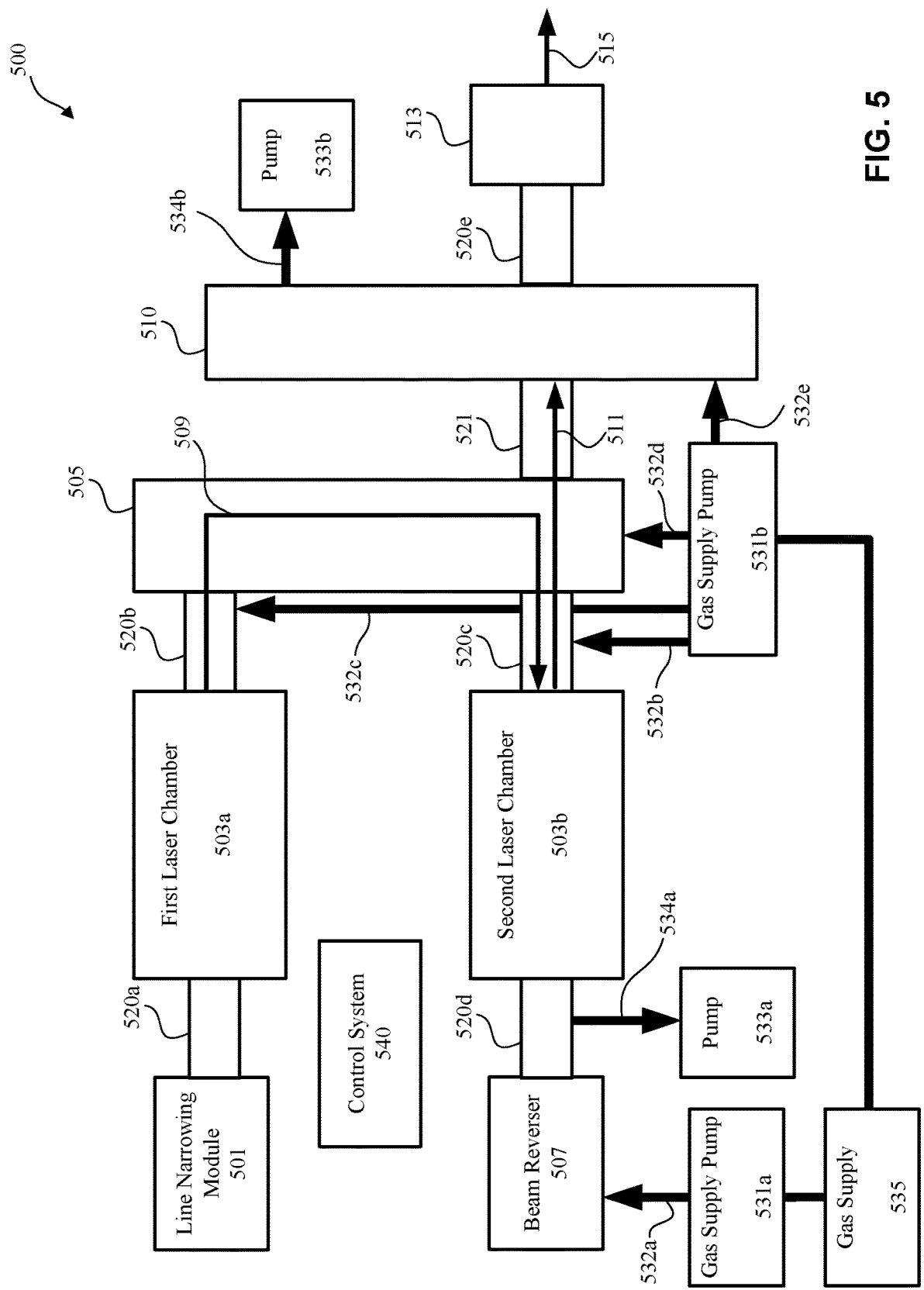
FIG. 5 illustrates another schematic of a laser source with a low pressure gas purge system, according to some embodiments of the present disclosure.

FIG. 5 illustrates another schematic of a laser source 500 having a gas purge system, according to some embodiments of the present disclosure. In some aspects, laser source 500 can be used as part of, or in addition to, source SO of lithographic apparatus 100 or 100'. Additionally, or alternatively, laser source 500 can be used in generating DUV radiation to be used in lithographic apparatus 100 or 100' or other DUV lithographic apparatuses.

According to some aspects, laser source 500 is one example of laser source 400 illustrated in FIG. 4. As illustrated in FIG. 5, laser source 500 can include a dual-chamber laser source. For example, laser source 500 can include a first laser chamber 503a and a second laser chamber 503b. In one exemplary embodiment, first laser chamber 503a can include or be part of a master oscillator. For example, laser source 500 can include the master oscillator where the maser oscillator contains first laser chamber 503a. In this example, second laser chamber 503b can include or be part of a power amplifier. For example, the laser source can include the power amplifier where the power amplifier contains second laser chamber 503b. Although some aspects of this disclosure are discussed with respect to a dual-chamber laser source, the embodiments of this disclosure are not limited to these examples. The embodiments of this disclosure can be applied to laser sources with one chamber or to laser sources with multiple laser chambers.

According to some embodiments, first chamber 503a generates a first laser beam 509, which is directed to second laser chamber 503b where first laser beam 509 is amplified to produce a second laser beam 511. Second laser beam 511 is directed to optional optical pulse stretcher 510, optional bellows 520e, and optional shutter module 513. Third laser beam 515 is output from shutter module 513 to the lithographic apparatus (e.g., lithographic apparatus 100 and/or 110').

According to some aspects, each laser chamber 503a and 503b contains a mixture of gases. For example, in an excimer laser source, first laser chamber 503a and second laser chamber 503b can contain a halogen, for example, fluorine, along with other gases such as argon, neon, and possibly others in different partial pressures that add up to a total pressure. Laser chambers 503a and 503b can include other gases used in producing and amplifying laser beams. Laser chambers 503a and 503b can include the same or different mixtures of gases.

In some aspects of the disclosure, laser source 500 can include (or can be coupled) to various suitable gas sources (not shown) to provide the gas to laser chambers 503a and 503b. For example, a gas source (not shown) can be coupled to first laser chamber 503a to provide the gas mixture used for generating first laser beam 509. Additionally, a gas source (not shown) can be coupled to second laser chamber 503b to provide the gas mixture used for generating second laser beam 511. In some examples, the gas sources can be coupled to laser chambers 503a and 503b, respectively, through valves (not shown). A control system (for example, control system 540) can be used to control the valves for sending gas from the gas sources to laser chambers 503*a* and 503*b*. In some aspects of the disclosure, the gas source for first laser chamber 503*a* can contain a mixture of gases including, but not limited to, fluorine, argon and neon. According to some aspects, the gas source for second laser chamber 503*b* can contain a mixture of argon, neon and/or other gases, but no fluorine. However, other gas mixtures such as including krypton can be used in these gas sources.

As discussed above, first laser chamber 503*a* is configured to generate first laser beam 509. In some examples, before leaving first laser chamber 503*a*, first laser beam 509 is configured to go through line narrowing module 501. According to some aspects of this disclosure, line narrowing module 501 is positioned and configured to select one or more center wavelengths around a narrow band of wavelengths. In some examples, the bandwidth of the narrow band can also be selected to be, for example, of as narrow a bandwidth as possible. In some examples, line narrowing module 501 can employ a variety of center wavelength selection optical elements (e.g., of the dispersive variety), which can reflect back into the optical path of, for example, the laser oscillating resonance chamber light of the selected center wavelength and of a narrowed bandwidth, depending on a number of physical parameters of line narrowing module 501 and optical parameters and performance capabilities of the wavelength selective optical element (e.g., a dispersive optical element) used. In some examples, line narrowing module 501 can include a reflective grating. First laser chamber 503*a*, line narrowing module 501, and an output coupler module (not shown) can be configured to be an oscillator cavity for a seed laser to oscillate to form laser beam 509.

After being generated by first laser chamber 503*a* and going through (and being reflected within) line narrowing module 501, first laser beam 509 is output from first laser chamber 503*a* and is directed toward second laser chamber 503*b*.

According to some examples, laser source 500 can include one or more bellows 520*a*-520*d* connecting one or more modules of laser source 500. For example, bellows 520*a* is coupled between line narrowing module 501 and first laser chamber 503*a*. In some examples, line narrowing module 501 and bellows 520*a* are coupled such that the gas pressure inside line narrowing module 501 is same as or similar to the gas pressure in bellows 520*a*. Alternatively, line narrowing module 501 and bellows 520*a* are coupled such that the gas pressure inside line narrowing module 501 is different than the gas pressure in bellows 520*a*. In some examples, line narrowing module 501 and/or bellows 520*a* are coupled to a gas purge system (not shown) configured to supply a purge gas (e.g., nitrogen) to line narrowing module 501 and/or bellows 520*a* at the pressure of about atmospheric pressure. In other words, the gas purge system (not shown) is configured to supply the purge gas to line narrowing module 501 and/or bellows 520*a* operates at a gas pressure different from the gas pressure at which gas purge system 408 of FIG. 4 operates when used as the low pressure gas purge system.

As illustrated in FIG. 5, and according to some aspects of the disclosure, first laser beam 509 is directed by optical system 505 toward second laser chamber 503*b*. According to some examples, optical system 505 is coupled to first laser chamber 503*a* using bellows 520*b* and is coupled to second laser chamber 503*b* using bellows 520*c*. Optical system 505 can include one or more optical modules. For example, optical system 505 can include a wavelength metrology module (not shown). In some non-limiting examples, the wavelength metrology module can include a spectrometer for fine wavelength measurement and a coarser resolution grating spectrometer. The wavelength metrology module can include other components.

Optical system 505 can also include one or more optical components for directing laser beam 509 toward second laser chamber 503*b*. In some examples, these one or more optical components can include a first wavefront engineering box and a second wavefront engineering box (not shown). In some examples, the first wavefront engineering box receives first laser beam 509 from first laser chamber 503*a* and directs it toward the second wavefront engineering box. The second wavefront engineering box directs first laser beam 509 toward second laser chamber 503*b*. In some examples, the first wavefront engineering box can include, but is not limited to, component(s) for beam expansion with, for example, a multi prism beam expander and coherence busting, for example, in the form of an optical delay path. In some examples, the second wavefront engineering box can include a partially reflective input/output coupler and a maximally reflective mirror for the nominal operating wavelength and one or more prisms. In some examples, these one or more optical components for redirecting first laser beam 509 can also include a tube for directing first laser beam 509.

In some examples, optical system 505 can also include a bandwidth analysis module (not shown) as discussed below. It is noted that although some exemplary modules/components are discussed for optical system 505, the aspects of this disclosure are not limited to these examples. Optical system 505 can include more, less, or different modules/components.

After first laser beam 509 is directed toward second laser chamber 503*b*, first laser beam 509 enters second laser chamber 503*b*. In some aspects, second laser chamber 503*b* can include or be part of a power amplifier and is configured to amplify first laser beam 509. Beam reverser 507 is configured to receive the amplified laser beam and redirect it back toward second laser chamber 503*b*, according to some aspects. Beam reverser 507 and second laser chamber 503*b* can be operationally coupled to each other using, for example, bellows 520*d*.

According to some embodiments, the amplified laser beam 511 can be output from second laser chamber 503*b* and go through the bandwidth analysis module (not shown) of optical system 505. The bandwidth analysis module can receive second (amplified) laser beam 511 and pick off a portion for metrology purposes, for example, to measure the output bandwidth and pulse energy.

Second laser beam 511 can be input to optional optical pulse stretcher 510, where copies of second laser beam 511 can delayed and recombined to, for example, reduce speckle. Third laser beam 515 is output from optical pulse stretcher 510 and optional shutter module 513 (e.g., an auto shutter) to the lithographic apparatus. In some examples, optical pulse stretcher 510 is operationally coupled to optical system 505 through tube 521 and optical pulse stretcher 510 is operationally coupled to shutter module 513 using bellows 520*e*.

According to some aspects of this disclosure, optical system 403 of laser source 400 of FIG. 4 can correspond to one or more of optical system 505, beam reverser 507, optical pulse stretcher 510, shutter module 513, tube 521, and/or bellows 520*b*-520*e*. In some examples, one or more of optical system 505, beam reverser 507, optical pulse stretcher 510, shutter module 513, tube 521, and/or bellows 520*b*-520*e* are coupled to a low pressure gas purge system (e.g., gas purge system 408 of FIG. 4 when used as the low pressure gas purge system). The low pressure gas purge system is configured to supply the purge gas (e.g., nitrogen) to one or more of optical system 505, beam reverser 507, optical pulse stretcher 510, shutter module 513, tube 521, and/or bellows 520b-520e at a gas pressure less than atmospheric pressure.

According to some aspects of this disclosure, the low pressure gas purge system (e.g., gas purge system 408 of FIG. 4 when used as the low pressure gas purge system) includes one or more gas supply pumps (e.g., gas supply pumps 531a and 531b), one or more pumps (e.g., pumps 533a and 533b), one or more gas conduits (e.g., gas conduits 532a-d, 534a, and 534b), and one or more gas supplies (e.g., gas supply 535).

It is noted that although FIG. 5 is discussed with multiple optical modules/systems coupled to the low pressure gas purge system, the aspects of this disclosure can include more, less, or other optical modules/systems coupled to the low pressure gas purge system. Also, the low pressure gas purge system of FIG. 5 can include more or less pumps, gas supplies, and/or conduits.

According to some aspects, line narrowing module 501, bellows 520a, first laser chamber 503a, and second laser chamber 503b are not coupled to the low pressure gas purge system. For example, as discussed above, the gas purge system (not shown) used for line narrowing module 501 and bellows 520a is configured to supply the purge gas to line narrowing module 501 and/or bellows 520a at a gas pressure different from the gas pressure at which the low pressure gas purge system for one or more of optical system 505, beam reverser 507, optical pulse stretcher 510, shutter module 513, tube 521, and/or bellows 520b-520e operates.

In some examples, beam reverser 507 and bellows 520d are coupled such that the gas pressure inside beam reverser 507 is same as or similar to the gas pressure in bellows 520d. Alternatively, beam reverser 507 and bellows 520d are coupled such that the gas pressure inside beam reverser 507 is different than the gas pressure in bellows 520d. According to some aspects, beam reverser 507 and bellows 520d can be operationally coupled to gas supply pump 531 (through gas supply conduit 532a) and to pump 533a (through gas conduit 534a). Gas supply pump 531a (which is similar to gas supply pump 409 of FIG. 4) can supply the purge gas (e.g., nitrogen) from, for example, gas supply 535 to beam reverser 507 and bellows 520d at a pressure less than atmospheric pressure (as discussed above with respect to gas purge system 408 of FIG. 4 when used as the low pressure gas purge system). Pump 533a (which is similar to pump 411 of FIG. 4) is configured to substantially remove gas (e.g., oxygen) from beam reverser 507 and bellows 520d (as discussed above with respect to gas purge system 408 of FIG. 4 when used as the low pressure gas purge system).

Although gas supply pump 531a is coupled to beam reverser 507 and pump 533a is coupled to bellows 520d, the aspects of this disclosure can include any combination of connections between beam reverser 507 and/or bellows 520d and gas supply pump 531a and pump 533a.

In some examples, optical system 505, optical pulse stretcher 510, shutter module 513, bellows 520b, 520c, 520e, and tube 521 are coupled such that the gas pressure inside them is same or similar. Alternatively, optical system 505, optical pulse stretcher 510, shutter module 513, bellows 520b, 520c, 520e, and tube 521 may be coupled such that the gas pressure inside them is different. According to some aspects of the disclosure, one or more gas supply pumps 531b can be operationally coupled to one or more of optical system 505, optical pulse stretcher 510, shutter module 513, bellows 520b, 520c, 520e, and tube 521. Gas supply pump 531b (which is similar to gas supply pump 409 of FIG. 4) can supply the purge gas (e.g., nitrogen) from, for example, gas supply 535 to one or more of optical system 505, optical pulse stretcher 510, shutter module 513, bellows 520b, 520c, 520e, and tube 521 at a pressure less than atmospheric pressure (as discussed above with respect to gas purge system 408 of FIG. 4 when used as the low pressure gas purge system).

In some examples, gas supply pump 531b can be coupled to bellows 520c using gas supply conduit 532b. Gas supply pump 531b can be coupled to bellows 520d using gas supply conduit 532b. Gas supply pump 531b can be coupled to optical system 505 using gas supply conduit 532d. Gas supply pump 531b can be coupled to optical pulse stretcher 510 using gas supply conduit 532e. Gas supply pump 531b can also be coupled to tube 521, bellows 520e, and/or shutter module 513 using one or more conduits (not shown).

Pump 533b (which is similar to pump 411 of FIG. 4) is configured to substantially remove gas (e.g., oxygen) from one or more of optical system 505, optical pulse stretcher 510, shutter module 513, bellows 520b, 520c, 520e, and tube 521 (as discussed above with respect to gas purge system 408 of FIG. 4 when used as the low pressure gas purge system). In some examples, pump 533b can be coupled to optical pulse stretcher 510 using gas conduit 534b.

As discussed above, any number of gas supply pumps 531, pumps 533, gas supplies 535, and/or conduits 532 and 534 can be used for the low pressure gas purge system. Also, any connection and/or any number of connections between the low pressure gas purge system and one or more of optical system 505, beam reverser 507, optical pulse stretcher 510, shutter module 513, bellows 502b-e, and tube 521 can be used.

In some examples, the low pressure gas purge system of FIG. 5 can include one or more sensors and controllers (e.g., similar to controller/sensor 412 of FIG. 4) to, for example, measure and/or control the gas pressure(s). The one or more sensors and controllers can be part of and/or be coupled to control system 540. For example, control system 540 can be configured to measure the pressure of the purge gas (e.g., nitrogen) supplied to one or more of optical system 505, beam reverser 507, optical pulse stretcher 510, shutter module 513, bellows 502b-e, and tube 521. Additionally, or alternatively, control system 540 can be configured to measure the pressure of the gas (e.g., oxygen) removed from one or more of optical system 505, beam reverser 507, optical pulse stretcher 510, shutter module 513, bellows 502b-e, and tube 521.

For example, control system 540 can be configured to measure the pressure at gas supply pumps 531a and/or 531b, at one or more of optical system 505, beam reverser 507, optical pulse stretcher 510, shutter module 513, bellows 502b-e, and tube 521, pumps 533a and/or 533b, gas supply 535, and/or conduits 532 and/or 534. Additionally, or alternatively, control system 540 can be configured to control gas supply pumps 531a and/or 531b and/or pumps 533a and/or 533b based on, for example, the measured pressure(s) and one or more pressure set points.

According to some embodiments, control system 540 can be configured to perform other operations in laser source 500. For example, control system 540 can control one or more gas sources (not shown) that provide gas to laser chambers 503a and 503b. As another example, control system 540 can be connected to one or more temperature sensors in laser chambers 503a and 503b to detect and/or control the gas temperatures in laser chambers 503a and 503b.

Figure 6:
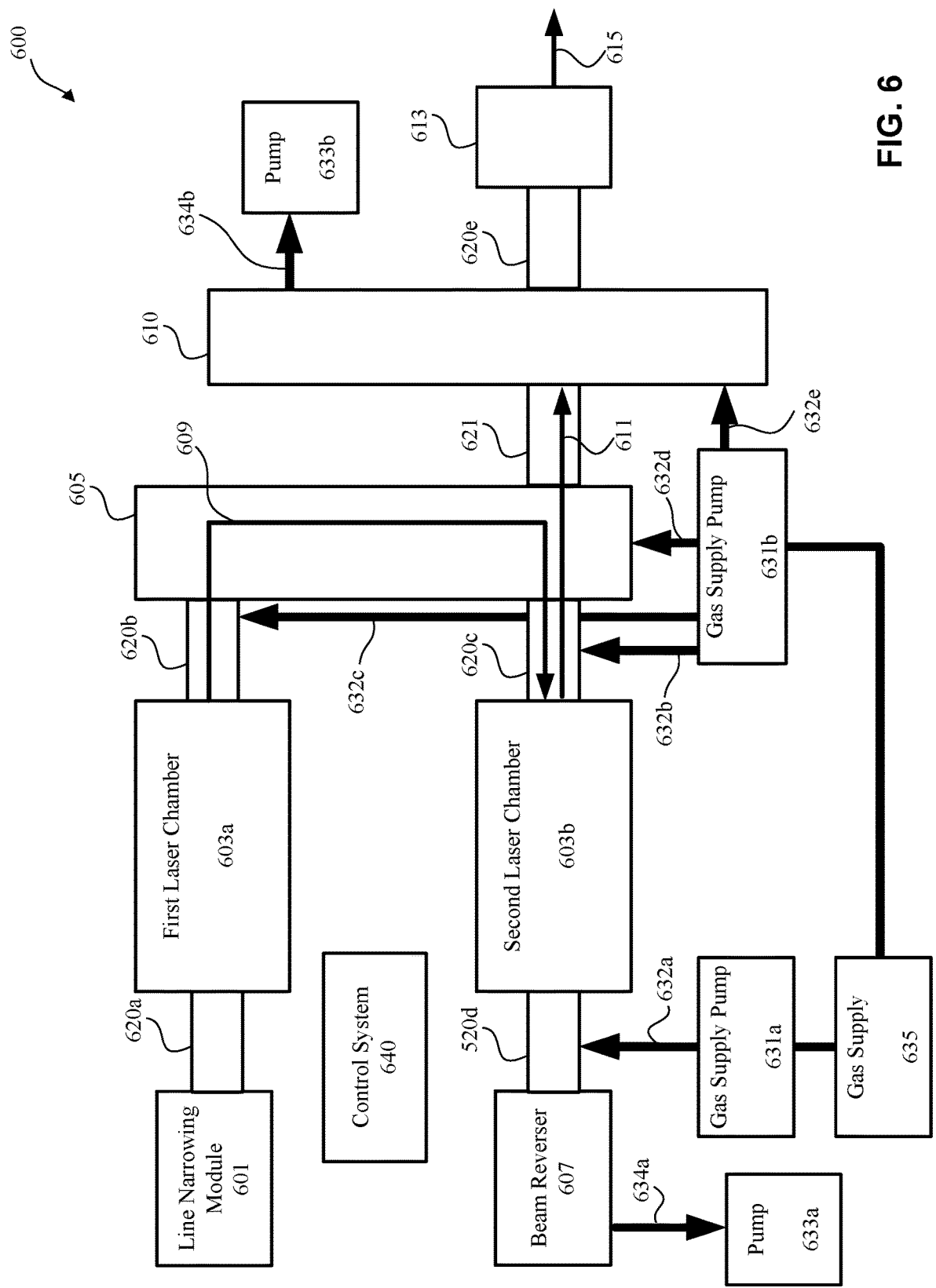
FIG. 6 illustrates another schematic of a laser source with a helium gas purge system, according to some embodiments of the present disclosure.

FIG. 6 illustrates another schematic of a laser source 600 having a gas purge system, according to some embodiments of the present disclosure. In some aspects, laser source 600 can be used as part of, or in addition to, source SO of lithographic apparatus 100 or 100'. Additionally, or alternatively, laser source 600 can be used in generating DUV radiation to be used in lithographic apparatus 100 or 100' or other DUV lithographic apparatuses.

According to some aspects, laser source 600 is one example of laser source 400 illustrated in FIG. 4. As illustrated in FIG. 6, laser source 600 can include a dual-chamber laser source. For example, laser source 600 can include a first laser chamber 603a and a second laser chamber 603b. In one exemplary embodiment, first laser chamber 603a can include or be part of a master oscillator. For example, laser source 600 can include the master oscillator where the maser oscillator contains first laser chamber 603a. In this example, second laser chamber 603b can include or be part of a power amplifier. For example, the laser source can include the power amplifier where the power amplifier contains second laser chamber 603b. Although some aspects of this disclosure are discussed with respect to a dual-chamber laser source, the embodiments of this disclosure are not limited to these examples. The embodiments of this disclosure can be applied to laser sources with one chamber or to laser sources with multiple laser chambers.

According to some embodiments, first chamber 603a generates a first laser beam 609, which is directed to second laser chamber 603b where first laser beam 609 is amplified to produce a second laser beam 611. Second laser beam 611 is directed to optional optical pulse stretcher 610, optional bellows 620e, and optional shutter module 613. Third laser beam 615 is output from shutter module 613 to the lithographic apparatus (e.g., lithographic apparatus 100 and/or 110').

According to some aspects, laser chambers 603a and 603b are similar to laser chambers 503a and 503b, respectively, as discussed above with respect to FIG. 5. In some aspects of the disclosure, laser source 600 can include (or can be coupled) to various suitable gas sources (not shown) to provide the gas to laser chambers 603a and 603b. For example, a gas source (not shown) can be coupled to first laser chamber 603a to provide the gas mixture used for generating first laser beam 609. Additionally, a gas source (not shown) can be coupled to second laser chamber 603b to provide the gas mixture used for generating second laser beam 611. In some examples, the gas sources can be coupled to laser chambers 603a and 603b, respectively, through valves (not shown). A control system (for example, control system 640) can be used to control the valves for sending gas from the gas sources to laser chambers 603a and 603b. In some aspects of the disclosure, the gas source for first laser chamber 603a can contain a mixture of gases including, but not limited to, fluorine, argon and neon. According to some aspects, the gas source for second laser chamber 603b can contain a mixture of argon, neon and/or other gases, but no fluorine. However, other gas mixtures such as including krypton can be used in these gas sources.

As discussed above, first laser chamber 603a is configured to generate first laser beam 609. In some examples, before leaving first laser chamber 603a, first laser beam 609 is configured to go through line narrowing module 601. According to some aspects of this disclosure, line narrowing module 601 is similar to line narrowing module 501 of FIG. 5. In some examples, first laser chamber 603a, line narrowing module 601, and an output coupler module (not shown) can be configured to be an oscillator cavity for a seed laser to oscillate to form laser beam 609.

After being generated by first laser chamber 603a and going through (and being reflected within) line narrowing module 601, first laser beam 609 is output from first laser chamber 603a and is directed toward second laser chamber 603b.

According to some examples, laser source 600 can include one or more bellows 620 connecting one or more modules of laser source 600. For example, bellows 620a is coupled between line narrowing module 601 and first laser chamber 603a. In some examples, line narrowing module 601 and bellows 620a are coupled such that the gas pressure inside line narrowing module 601 is same as or similar to the gas pressure in bellows 620a. Alternatively, line narrowing module 601 and bellows 620a are coupled such that the gas pressure inside line narrowing module 601 is different than the gas pressure in bellows 620a. In some examples, line narrowing module 601 and/or bellows 620a are coupled to a gas purge system (not shown) configured to supply a purge gas (e.g., nitrogen) to line narrowing module 601 and/or bellows 620a at the pressure of about atmospheric pressure. In other words, the gas purge system (not shown) is configured to supply the purge gas to line narrowing module 601 and/or bellows 620a operates with a gas (e.g., nitrogen) that is different from the gas (e.g., helium) used by gas purge system 408 of FIG. 4 when used as the helium gas purge system.

As illustrated in FIG. 6, and according to some aspects of the disclosure, first laser beam 609 is directed by optical system 605 toward second laser chamber 603b. According to some examples, optical system 605 is coupled to first laser chamber 603a using bellows 620b and is coupled to second laser chamber 603b using bellows 620c. Optical system 605 can be similar to optical system 505 of FIG. 5 and can include one or more optical modules as discussed with respect to FIG. 5.

Optical system 605 can also include one or more optical components for directing laser beam 609 toward second laser chamber 603b. In some examples, these one or more optical components can include a first wavefront engineering box and a second wavefront engineering box (not shown). In some examples, the first wavefront engineering box receives first laser beam 609 from first laser chamber 603a and directs it toward the second wavefront engineering box. The second wavefront engineering box directs first laser beam 609 toward second laser chamber 603b. In some examples, the first wavefront engineering box can include, but is not limited to, component(s) for beam expansion with, for example, a multi prism beam expander and coherence busting, for example, in the form of an optical delay path. In some examples, the second wavefront engineering box can include a partially reflective input/output coupler and a maximally reflective mirror for the nominal operating wavelength and one or more prisms. In some examples, these one or more optical components for redirecting first laser beam 609 can also include a tube for directing first laser beam 609.

In some examples, optical system 605 can also include a bandwidth analysis module (not shown) as discussed with respect to FIG. 5. It is noted that although some exemplary modules/components are discussed for optical system 605, the aspects of this disclosure are not limited to these examples. Optical system 605 can include more, less, or different modules/components.

After first laser beam 609 is directed toward second laser chamber 603*b*, first laser beam 609 enters second laser chamber 603*b*. In some aspects, second laser chamber 603*b* can include or be part of a power amplifier and is configured to amplify first laser beam 609. Beam reverser 607 is configured to receive the amplified laser beam and redirect it back toward second laser chamber 603*b*, according to some aspects. Beam reverser 607 and second laser chamber 503*b* can be operationally coupled to each other using, for example, bellows 620*d*.

According to some embodiments, the amplified laser beam 611 can be output from second laser chamber 603*b* and go through the bandwidth analysis module (not shown) of optical system 605. The bandwidth analysis module can receive second (amplified) laser beam 611 and pick off a portion for metrology purposes, for example, to measure the output bandwidth and pulse energy.

Second laser beam 611 can be input to optional optical pulse stretcher 610, where copies of second laser beam 611 can delayed and recombined to, for example, reduce speckle. Third laser beam 615 is output from optical pulse stretcher 610 and optional shutter module 613 (e.g., an auto shutter) to the lithographic apparatus. In some examples, optical pulse stretcher 610 is operationally coupled to optical system 605 through tube 621 and optical pulse stretcher 610 is operationally coupled to shutter module 613 using bellows 620*e*

According to some aspects of this disclosure, optical system 403 of laser source 400 of FIG. 4 can correspond to one or more of optical system 605, beam reverser 607, optical pulse stretcher 610, shutter module 613, tube 621, and/or bellows 620*b*-620*e*. In some examples, one or more of optical system 605, beam reverser 607, optical pulse stretcher 610, shutter module 613, tube 621, and/or bellows 620*b*-620*e* are coupled to a helium purge system (e.g., gas purge system 408 of FIG. 4 when used as the helium gas purge system). The helium purge system is configured to supply the purge gas (e.g., helium) to one or more of optical system 605, beam reverser 607, optical pulse stretcher 610, shutter module 613, tube 621, and/or bellows 620*b*-620*e*.

According to some aspects of this disclosure, the helium purge system (e.g., gas purge system 408 of FIG. 4 when used as the helium gas purge system) includes one or more gas supply pumps (e.g., gas supply pumps 631*a* and 631*b*), one or more pumps (e.g., pumps 633*a* and 633*b*), one or more gas conduits (e.g., gas conduits 632*a-d*, 634*a*, and 634*b*), and one or more gas supplies (e.g., gas supply 535).

It is noted that although FIG. 6 is discussed with multiple optical modules/systems coupled to the low pressure gas purge system, the aspects of this disclosure can include more, less, or other optical modules/systems coupled to the low pressure gas purge system. Also, the helium purge system of FIG. 6 can include more or less pumps, gas supplies, and/or conduits.

According to some aspects, line narrowing module 601, bellows 620*a*, first laser chamber 603*a*, and second laser chamber 603*b* are not coupled to the helium gas purge system. For example, as discussed above, the gas purge system (e.g., nitrogen purge system—not shown) used for narrowing module 601 and bellows 620*a* is configured to supply the nitrogen purge gas to line narrowing module 601 and/or bellows 620*a* different from the helium purge gas, which the helium purge system uses for one or more of optical system 605, beam reverser 607, optical pulse stretcher 610, shutter module 613, tube 621, and/or bellows 620*b*-620*e*.

In some examples, beam reverser 607 and bellows 620*d* are coupled such that the gas pressure inside beam reverser 607 is the same as or similar to the gas pressure in bellows 620*d*. Alternatively, beam reverser 607 and bellows 620*d* may be coupled such that the gas pressure inside beam reverser 607 is different than the gas pressure in bellows 620*d*. According to some aspects, beam reverser 607 and bellows 620*d* can be operationally coupled to pump 633*a* (through gas conduit 634*a*) and to gas supply pump 631 (through gas supply conduit 632*a*). Gas supply pump 631*a* (which is similar to gas supply pump 409 of FIG. 4) can supply the purge gas (e.g., helium) from, for example, gas supply 635 to bellows 620*d* and beam reverser 607. Pump 633*a* (which is similar to pump 411 of FIG. 4) is configured to substantially remove gas (e.g., oxygen) from beam reverser 607 and bellows 620*d* (as discussed above with respect to gas purge system 408 of FIG. 4 when used as the helium gas purge system).

Although gas supply pump 631*a* is coupled to bellows 620*d* and pump 633*a* is coupled to beam reverser 607, the aspects of this disclosure can include any combination of connections between beam reverser 607 and/or bellows 620*d* and gas supply pump 631*a* and pump 633*a*.

In some examples, optical system 605, optical pulse stretcher 610, shutter module 613, bellows 620*b*, 620*c*, 620*e*, and tube 621 are coupled such that the gas pressure inside them is the same or similar. Alternatively, optical system 605, optical pulse stretcher 610, shutter module 613, bellows 620*b*, 620*c*, 620*e*, and tube 621 may be coupled such that the gas pressure inside them is different. According to some aspects of the disclosure, one or more gas supply pumps 631*b* can be operationally coupled to one or more of optical system 605, optical pulse stretcher 610, shutter module 613, bellows 620*b*, 620*c*, 620*e*, and tube 621. Gas supply pump 631*b* (which is similar to gas supply pump 409 of FIG. 4) can supply the purge gas (e.g., helium) from, for example, gas supply 635 to one or more of optical system 605, optical pulse stretcher 610, shutter module 613, bellows 620*b*, 620*c*, 620*e*, and tube 621 (as discussed above with respect to gas purge system 408 of FIG. 4 when used as the helium gas purge system).

In some examples, gas supply pump 631*b* can be coupled to bellows 620*c* using gas supply conduit 632*b*. Gas supply pump 631*b* can be coupled to bellows 620*d* using gas supply conduit 632*b*. Gas supply pump 631*b* can be coupled to optical system 605 using gas supply conduit 632*d*. Gas supply pump 631*b* can be coupled to optical pulse stretcher 610 using gas supply conduit 632*e*. Gas supply pump 631*b* can also be coupled to tube 621, bellows 620*e*, and/or shutter module 613 using one or more conduits (not shown).

Pump 633*b* (which is similar to pump 411 of FIG. 4) is configured to substantially remove gas (e.g., oxygen) from one or more of optical system 605, optical pulse stretcher 610, shutter module 613, bellows 620*b*, 620*c*, 620*e*, and tube 621 (as discussed above with respect to gas purge system 408 of FIG. 4 when used as the helium gas purge system). In some examples, pump 633*b* can be coupled to optical pulse stretcher 610 using gas conduit 634*b*.

As discussed above, any number of gas supply pumps 631, pumps 633, gas supplies 635, and/or conduits 632 and 5634 can be used for the helium purge system. Also, any connection and/or any number of connections between the helium purge system and one or more of optical system 605, beam reverser 607, optical pulse stretcher 610, shutter module 613, bellows 602*b-e*, and tube 621 can be used.

In some examples, the helium purge system of FIG. 6 can include one or more sensors and controllers (e.g., similar to controller/sensor 412 of FIG. 4) to, for example, measure and/or control the gas pressure(s). The one or more sensors and controllers can be part of and/or be coupled to control system 640. For example, control system 640 can be configured to measure the pressure of the purge gas (e.g., helium) supplied to one or more of optical system 605, beam reverser 607, optical pulse stretcher 610, shutter module 613, bellows 602b-e, and tube 621. Additionally, or alternatively, control system 640 can be configured to measure the pressure of the gas (e.g., oxygen) removed from one or more of optical system 605, beam reverser 607, optical pulse stretcher 610, shutter module 613, bellows 602b-e, and tube 621.

For example, control system 640 can be configured to measure the pressure at gas supply pumps 631a and/or 631b, at one or more of optical system 605, beam reverser 607, optical pulse stretcher 610, shutter module 613, bellows 602b-e, and tube 621, pumps 633a and/or 633b, gas supply 635, and/or conduits 632 and/or 634. Additionally, or alternatively, control system 640 can be configured to control gas supply pumps 631a and/or 631b and/or pumps 633a and/or 633b based on, for example, the measured pressure(s) and one or more pressure set points.

According to some embodiments, control system 640 can be configured to perform other operations in laser source 600. For example, control system 640 can control one or more gas sources (not shown) that provide gas to laser chambers 603a and 603b. As another example, control system 640 can be connected to one or more temperature sensors in laser chambers 603a and 603b to detect and/or control the gas temperatures in laser chambers 603a and 603b.

Some aspects of the disclosure (e.g., control system(s) SCS, 410, 412, 540 and/or 640) may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the embodiments in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc.

While specific embodiments of the disclosure have been described above, it will be appreciated that the embodiments may be practiced otherwise than as described. The description is not intended to limit the embodiments.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the present embodiments and the appended claims in any way.

Some embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

Other aspects of the invention are set out in the following numbered clauses.

1. A laser source, comprising:
a laser chamber configured to generate a first laser beam;
an optical system coupled to the laser chamber and configured to receive the first laser beam and output an output laser beam; and a gas purge system configured to supply a gas into the optical system at a pressure less than atmospheric pressure.

2. The laser source of clause 1, wherein the gas purge system comprises:
a gas supply pump configured to supply the gas into the optical system at the pressure less than atmospheric pressure.

3. The laser source of clause 2, wherein the gas purge system further comprises:
a second pump configured to substantially remove a second gas from the optical system.

4. The laser source of clause 3, wherein the gas comprises nitrogen and the second gas comprises oxygen.

5. The laser source of clause 1, wherein the gas comprises nitrogen and the pressure is between about 50 Torr and about 700 Torr.

6. The laser source of clause 1, wherein:
the optical system comprises a first optical module and a second optical module; and
the gas purge system comprises:
a first gas supply pump coupled to the first optical module to supply the gas into the first optical module at the pressure less than atmospheric pressure; and
a second gas supply pump coupled to the second optical module to supply the gas into the second optical module at the pressure less than atmospheric pressure.

7. A laser source, comprising:
a laser chamber configured to generate a first laser beam; and
an optical system coupled to the laser chamber and configured to receive the first laser beam and output an output laser beam,
wherein the optical system comprises a gas at a pressure less than atmospheric pressure.

8. The laser source of clause 7, further comprising:
a gas purge system configured to supply the gas into the optical system at the pressure less than atmospheric pressure.

9. The laser source of clause 8, wherein the gas purge system comprises:
a gas supply pump configured to supply the gas into the optical system at the pressure less than atmospheric pressure; and
a second pump configured to substantially remove a second gas from the optical system.

10. The laser source of clause 9, wherein the gas comprises nitrogen and the second gas comprises oxygen.

11. The laser source of clause 7, wherein the gas comprises nitrogen and the pressure is between about 50 Torr and about 700 Torr.

12. The laser source of clause 7, further comprising:
a second laser chamber configured to at least indirectly receive the first laser beam and amplify the first laser beam to generate a second laser beam,
wherein the optical system is configured to receive the second laser beam and output the output laser beam.

13. The laser source of clause 7, further comprising:
an optical module coupled to the laser chamber, wherein the optical module comprises a second gas at a pressure about atmospheric pressure.

14. A laser source, comprising:
a first laser chamber configured to generate a first laser beam;
a second laser chamber configured to at least indirectly receive the first laser beam and amplify the first laser beam to generate a second laser beam;
a first optical system configured to direct the first laser beam toward the second laser chamber;
a second optical system configured to receive the second laser beam and direct the second laser beam as an output laser beam of the laser source; and
a gas purge system configured to pump a gas into the first and second optical systems at a pressure less than atmospheric pressure.

15. The laser source of clause 14, wherein the gas purge system comprises:
a gas supply pump configured to supply the gas into the first and second optical systems at the pressure less than atmospheric pressure; and
a second pump configured to substantially remove a second gas from the first and second optical systems.

16. The laser source of clause 14, wherein the gas comprises nitrogen and the pressure is between about 50 Torr and about 700 Torr.

17. The laser source of clause 14, further comprising:
an optical module coupled to the first laser chamber, wherein the optical module comprises a second gas at a pressure about atmospheric pressure.

18. The laser source of clause 14, further comprising:
an optical module coupled to the second laser chamber, wherein the gas purge system is configured to pump the gas into the optical module at the pressure less than atmospheric pressure.

19. A lithographic apparatus, comprising:
an illumination system configured to condition a radiation beam;
a projection system configured to project a pattern imparted to the radiation beam onto a substrate,
wherein the illumination system comprises a laser source, the laser source comprising: a laser chamber configured to generate a first laser beam; and
an optical system coupled to the laser chamber and configured to receive the first laser beam and output an output laser beam,
wherein the optical system comprises nitrogen gas at a pressure less than atmospheric pressure.

20. An apparatus, comprising:
a laser chamber configured to generate a first laser beam;
an optical system coupled to the laser chamber and configured to receive the first laser beam and output an output laser beam; and
a gas purge system configured to supply a gas into the optical system at a pressure less than atmospheric pressure.

21. A laser source, comprising:
a laser chamber configured to generate a first laser beam;
an optical system coupled to the laser chamber and configured to receive the first laser beam and output an output laser beam; and
a gas purge system configured to supply a helium gas into the optical system.

22. The laser source of clause 21, wherein the gas purge system comprises:
a gas supply pump configured to supply the helium gas into the optical system.

23. The laser source of clause 22, wherein the gas purge system further comprises:
a second pump configured to substantially remove a second gas from the optical system.

24. The laser source of clause 23, wherein the second gas comprises oxygen.

25. The laser source of clause 21, wherein the gas purge system comprises:

a gas supply pump configured to supply the helium gas into the optical system at a pressure less than atmospheric pressure.

26. The laser source of clause 21, wherein:
the optical system comprises a first optical module and a second optical module; and
the gas purge system comprises:
a first gas supply pump coupled to the first optical module to supply the helium gas into the first optical module; and
a second gas supply pump coupled to the second optical module to supply the helium gas into the second optical module.

27. A laser source, comprising:
a laser chamber configured to generate a first laser beam; and
an optical system coupled to the laser chamber and configured to receive the first laser beam and output an output laser beam,
wherein the optical system comprises a helium gas.

28. The laser source of clause 27, further comprising:
a gas purge system configured to supply the helium gas into the optical system.

29. The laser source of clause 28, wherein the gas purge system comprises:
a gas supply pump configured to supply the helium gas into the optical system; and
a second pump configured to substantially remove a second gas from the optical system.

30. The laser source of clause 29, wherein the second gas comprises oxygen.

31. The laser source of clause 27, further comprising:
a second laser chamber configured to at least indirectly receive the first laser beam and amplify the first laser beam to generate a second laser beam,
wherein the optical system is configured to receive the second laser beam and output the output laser beam.

32. The laser source of clause 27, further comprising:
an optical module coupled to the laser chamber, wherein the optical module comprises a second gas at a pressure about atmospheric pressure.

33. A laser source, comprising:
a first laser chamber configured to generate a first laser beam;
a second laser chamber configured to at least indirectly receive the first laser beam and amplify the first laser beam to generate a second laser beam;
a first optical system configured to direct the first laser beam toward the second laser chamber;
a second optical system configured to receive the second laser beam and direct the second laser beam as an output laser beam of the laser source; and
a gas purge system configured to pump a helium gas into the first and second optical systems.

34. The laser source of clause 33, wherein the gas purge system comprises:
a gas supply pump configured to supply the helium gas into the first and second optical systems; and
a second pump configured to substantially remove a second gas from the first and second optical systems.

35. The laser source of clause 33, further comprising:
an optical module coupled to the second laser chamber, wherein the gas purge system is configured to pump the helium gas into the optical module.

36. A lithographic apparatus, comprising:
an illumination system configured to condition a radiation beam;
a projection system configured to project a pattern imparted to the radiation beam onto a substrate,
wherein the illumination system comprises a laser source, the laser source comprising:
a laser chamber configured to generate a first laser beam; and
an optical system coupled to the laser chamber and configured to receive the first laser beam and output an output laser beam,
wherein the optical system comprises helium gas.

37. An apparatus, comprising:
a laser chamber configured to generate a first laser beam;
an optical system coupled to the laser chamber and configured to receive the first laser beam and output an output laser beam; and
a gas purge system configured to supply a helium gas into the optical system.

The breadth and scope of the present disclosure should not be limited by any of the above-described exemplary embodiments, but should be defined only in accordance with the following claims and their equivalents.

What is claimed is:

1. A laser source, comprising:
a laser chamber configured to generate a first laser beam; and
an optical system coupled to the laser chamber and configured to receive the first laser beam and output an output laser beam,
wherein the optical system comprises a gas at a pressure less than atmospheric pressure.

2. The laser source of claim 1, further comprising:
a gas purge system configured to supply the gas into the optical system at the pressure less than atmospheric pressure.

3. The laser source of claim 2, wherein the gas purge system comprises:
a gas supply pump configured to supply the gas into the optical system at the pressure less than atmospheric pressure; and
a second pump configured to substantially remove a second gas from the optical system.

4. The laser source of claim 3, wherein the gas comprises nitrogen and the second gas comprises oxygen.

5. The laser source of claim 2, wherein the gas purge system comprises a gas supply pump configured to supply the gas into the optical system at the pressure less than atmospheric pressure.

6. The laser source of claim 5, wherein the gas comprises nitrogen.

7. The laser source of claim 2, wherein the gas purge system further comprises a second pump configured to substantially remove a second gas from the optical system.

8. The laser source of claim 7, wherein the second gas comprises oxygen.

9. The laser source of claim 1, wherein the gas comprises nitrogen and the pressure is between about 50 Torr and about 700 Torr.

10. The laser source of claim 1, further comprising:
a second laser chamber configured to at least indirectly receive the first laser beam and amplify the first laser beam to generate a second laser beam,
wherein the optical system is configured to receive the second laser beam and output the output laser beam.

11. The laser source of claim 1, further comprising:
an optical module coupled to the laser chamber, wherein the optical module comprises a second gas at a pressure about atmospheric pressure.

12. The laser source of claim 1, wherein:
the optical system comprises a first optical module and a second optical module; and
the gas purge system comprises:
- a first gas supply pump coupled to the first optical module to supply the gas into the first optical module at the pressure less than atmospheric pressure; and
- a second gas supply pump coupled to the second optical module to supply the gas into the second optical module at the pressure less than atmospheric pressure.

13. A lithographic apparatus, comprising:
the laser source of claim 1;
an illumination system configured to condition a laser beam received from the laser source to produce a radiation beam; and
a projection system configured to project a pattern imparted to the radiation beam onto a substrate.

14. A laser source, comprising:
a first laser chamber configured to generate a first laser beam;
a second laser chamber configured to at least indirectly receive the first laser beam and amplify the first laser beam to generate a second laser beam;
a first optical system configured to direct the first laser beam toward the second laser chamber;
a second optical system configured to receive the second laser beam and direct the second laser beam as an output laser beam of the laser source; and
a gas purge system configured to pump a gas into the first and second optical systems at a pressure less than atmospheric pressure.

15. The laser source of claim 14, wherein the gas purge system comprises:
a gas supply pump configured to supply the gas into the first and second optical systems at the pressure less than atmospheric pressure; and
a second pump configured to substantially remove a second gas from the first and second optical systems.

16. The laser source of claim 14, wherein the gas comprises nitrogen and the pressure is between about 50 Torr and about 700 Torr.

17. The laser source of claim 14, further comprising:
an optical module coupled to the first laser chamber, wherein the optical module comprises a second gas at a pressure about atmospheric pressure.

18. The laser source of claim 14, further comprising:
an optical module coupled to the second laser chamber, wherein the gas purge system is configured to pump the gas into the optical module at the pressure less than atmospheric pressure.

19. A lithographic apparatus, comprising:
the laser source of claim 14;
an illumination system configured to condition a laser beam received from the laser source to produce a radiation beam; and
a projection system configured to project a pattern imparted to the radiation beam onto a substrate.

20. A lithographic apparatus, comprising:
a laser source configured generate an output laser beam;
an illumination system configured to condition a radiation beam from the output laser beam of the laser source; and
a projection system configured to project a pattern imparted to the radiation beam onto a substrate,
wherein the laser source comprises:
- a laser chamber configured to generate a first laser beam; and
- an optical system coupled to the laser chamber and configured to receive the first laser beam and output the output laser beam,
- wherein the optical system comprises nitrogen gas at a pressure less than atmospheric pressure.

* * * * *